(12) United States Patent
Gao et al.

(10) Patent No.: US 10,644,156 B2
(45) Date of Patent: May 5, 2020

(54) METHODS, APPARATUS, AND SYSTEM FOR REDUCING GATE CUT GOUGING AND/OR GATE HEIGHT LOSS IN SEMICONDUCTOR DEVICES

(71) Applicant: GLOBALFOUNDRIES INC., Grand Cayman (KY)

(72) Inventors: Jinsheng Gao, Clifton Park, NY (US); Daniel Jaeger, Saratoga Springs, NY (US); Michael Aquilino, Gansevoort, NY (US); Patrick Carpenter, Saratoga Springs, NY (US); Xusheng Wu, Ballston Lake, NY (US); Haigou Huang, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/919,079

(22) Filed: Mar. 12, 2018

(65) Prior Publication Data

US 2019/0280114 A1 Sep. 12, 2019

(51) Int. Cl.
| | | |
|---|---|---|
| *H01L 29/78* | (2006.01) | |
| *H01L 29/06* | (2006.01) | |
| *H01L 29/423* | (2006.01) | |
| *H01L 29/66* | (2006.01) | |
| *H01L 21/8238* | (2006.01) | |
| *H01L 21/84* | (2006.01) | |
| *H01L 27/12* | (2006.01) | |
| *H01L 29/417* | (2006.01) | |

(52) U.S. Cl.
CPC .... *H01L 29/785* (2013.01); *H01L 21/823821* (2013.01); *H01L 21/823828* (2013.01); *H01L 21/845* (2013.01); *H01L 27/1211* (2013.01); *H01L 29/0673* (2013.01); *H01L 29/41775* (2013.01); *H01L 29/42392* (2013.01); *H01L 29/66545* (2013.01); *H01L 29/66553* (2013.01); *H01L 29/66795* (2013.01)

(58) Field of Classification Search
CPC ................................. H01L 29/66545
See application file for complete search history.

(56) References Cited

U.S. PATENT DOCUMENTS

| | | | | |
|---|---|---|---|---|
| 9,337,094 B1 * | 5/2016 | Pranatharthiharan | ....................... | |
| | | | | H01L 21/76897 |
| 10,269,654 B1 * | 4/2019 | Gao | ................. | H01L 29/66545 |
| 10,325,819 B1 * | 6/2019 | Gao | ................. | H01L 21/823828 |
| 10,381,267 B2 * | 8/2019 | Cheng | ............... | H01L 29/41791 |
| 10,388,788 B2 * | 8/2019 | Chen | ................ | H01L 21/76843 |
| 10,418,455 B2 * | 9/2019 | Zang | .................. | H01L 27/0924 |
| 2014/0291766 A1 * | 10/2014 | Hafez | ................ | H01L 27/0886 |
| | | | | 257/365 |

(Continued)

*Primary Examiner* — Victoria K. Hall
(74) *Attorney, Agent, or Firm* — Williams Mogan, P.C.

(57) ABSTRACT

Methods comprising providing a semiconductor substrate; a fin disposed on the semiconductor substrate; a dummy gate disposed over the fin, wherein the dummy gate has a top at a first height above the substrate; and an interlayer dielectric (ILD) disposed over the fin and adjacent to the dummy gate, wherein the ILD has a top at a second height above the substrate, wherein the second height is below the first height; and capping the ILD with a dielectric cap, wherein the dielectric cap has a top at the first height. Systems configured to implement the methods. Semiconductor devices produced by the methods.

12 Claims, 6 Drawing Sheets

(56) References Cited

U.S. PATENT DOCUMENTS

| | | | |
|---|---|---|---|
| 2015/0325575 A1* | 11/2015 | Park | H01L 29/165 |
| | | | 257/401 |
| 2016/0005828 A1* | 1/2016 | Kerber | H01L 29/42364 |
| | | | 324/762.09 |
| 2016/0104788 A1* | 4/2016 | Ryu | H01L 29/66545 |
| | | | 438/586 |
| 2016/0268435 A1* | 9/2016 | Lee | H01L 29/66795 |
| 2016/0308012 A1* | 10/2016 | Song | H01L 29/42376 |
| 2018/0151565 A1* | 5/2018 | Lee | H01L 21/02532 |
| 2018/0151716 A1* | 5/2018 | Fung | H01L 29/6653 |
| 2019/0006515 A1* | 1/2019 | Cheng | H01L 21/823475 |

* cited by examiner

METHODS, APPARATUS, AND SYSTEM FOR REDUCING GATE CUT GOUGING AND/OR GATE HEIGHT LOSS IN SEMICONDUCTOR DEVICES

BACKGROUND OF THE INVENTION

Field of the Invention

Generally, the present disclosure relates to the manufacture of sophisticated semiconductor devices, and, more specifically, to various methods and systems for reducing gate cut gouging and/or gate height loss in semiconductor devices.

Description of the Related Art

The technology explosion in the manufacturing industry has resulted in many new and innovative manufacturing processes. Today's manufacturing processes, particularly semiconductor manufacturing processes, call for a large number of significant steps. These process steps usually require a number of inputs that are generally fine-tuned to maintain proper manufacturing control.

The manufacture of semiconductor devices requires a number of discrete process steps to create a packaged semiconductor device from raw semiconductor material. Generally, a set of processing steps is performed on a group of semiconductor wafers, sometimes referred to as a lot, using semiconductor-manufacturing tools, such as an exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one region on the semiconductor wafer to another. In this manner, integrated circuit chips may be fabricated.

A number of process steps desired for use in the manufacture of FinFET semiconductor devices, in which the channel of the FET is in a fin disposed on a substrate and the gate of the FET is disposed over the fin, are improved if an interlayer dielectric (ILD) disposed adjacent to the gate maintains its height and the planarity of its top surface during those process steps. However, other process steps may reduce the height and/or gouge (form a depression in) the top surface of the ILD.

The present disclosure may address and/or at least reduce one or more of the problems identified above.

SUMMARY OF THE INVENTION

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

Generally, the present disclosure is directed to a method, comprising providing a semiconductor substrate; a fin disposed on the semiconductor substrate; a dummy gate disposed over the fin, wherein the dummy gate has a top at a first height above the substrate; and an interlayer dielectric (ILD) disposed over the fin and adjacent to the dummy gate, wherein the ILD has a top at a second height above the substrate, wherein the second height is below the first height; and capping the ILD with a dielectric cap, wherein the dielectric cap has a top at the first height.

The present disclosure also includes a semiconductor device, comprising a semiconductor substrate; a fin disposed on the semiconductor substrate; a gate stack disposed over the fin, wherein the gate stack has a top and sidewalls; an interlayer dielectric (ILD) adjacent one of the sidewalls of the gate, wherein the ILD has a top; and a dielectric cap disposed on the top of the ILD, wherein the dielectric cap has a top, and the top of the dielectric cap is substantially coplanar with the top of the gate.

The present disclosure also includes a semiconductor device manufacturing system adapted to implement one or more steps of the method.

The present disclosure may reduce height loss and/or top surface gouging of ILDs adjacent to gates in FinFET semiconductor devices.

BRIEF DESCRIPTION OF THE DRAWINGS

The disclosure may be understood by reference to the following description taken in conjunction with the accompanying drawings, in which like reference numerals identify like elements, and in which.

Figure 1:
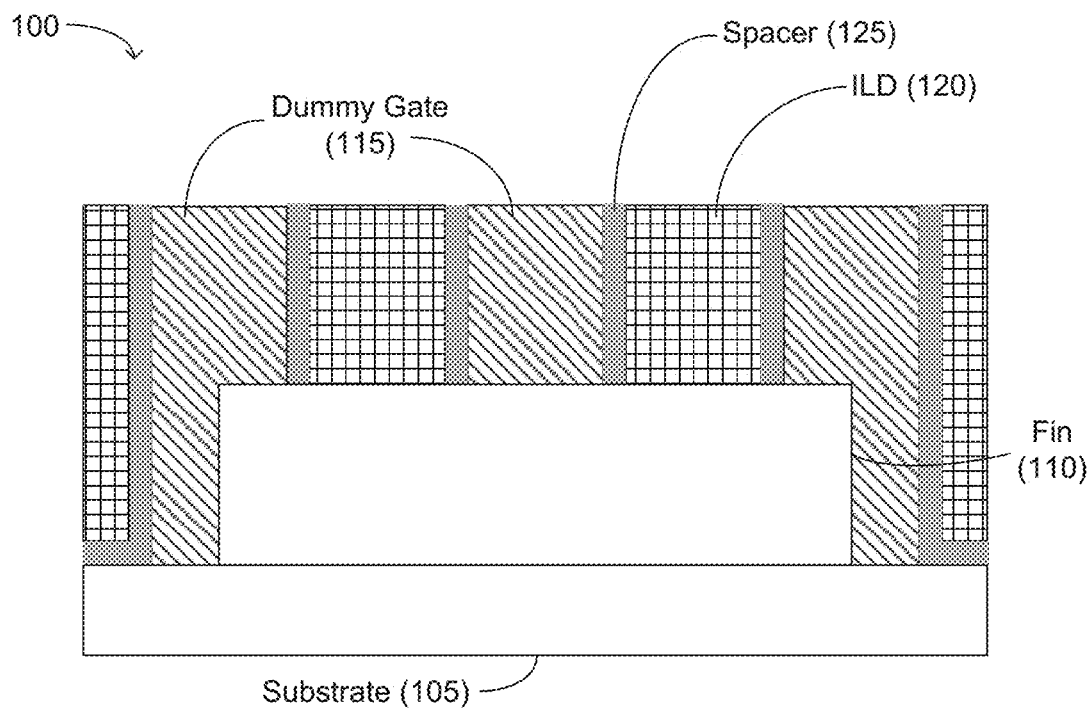
FIG. 1 illustrates a stylized depiction of a semiconductor structure, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the disclosure are described below. In the interest of clarity, not all features of an actual implementation are described in this specification.

It will, of course, be appreciated that, in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein are directed to methods of reducing step height differences in semiconductor structures during manufacture of such devices, as well as manufacturing systems adapted to implement one or more elements of such methods. Embodiments herein provide reducing step height differences between adjacent regions of a semiconductor structure, which may allow process steps that require a flat or planar surface (e.g., chamfering) to be performed during manufacture of the semiconductor structure. Embodiments herein provide for a method that may provide the advantage of reducing or eliminating height loss and/or gouging of ILDs adjacent to gates in FinFET semiconductor devices.

Turning to FIG. 1, a stylized cross-sectional depiction of a semiconductor structure 100 that may be used as a starting point for one or more methods disclosed herein is presented. The semiconductor structure 100 comprises a semiconductor substrate 105, upon which a fin 110 is formed. The semiconductor substrate 105 may be formed of bulk silicon, silicon-on-insulator (SOI), or other materials known to the person of ordinary skill in the art.

The fin 110 may comprise silicon, silicon-germanium, or other appropriate materials. The term "fin" is used for convenience; in other embodiments, not depicted in FIG. 1, the fin 110 may be a nanosheet structure, nanowire structure, or the like. The fin 110 may comprise one or more dopants. Alternatively or in addition, the fin 110 may comprise an epitaxial material, such as epitaxial silicon or epitaxial silicon-germanium, on part or all of the top and/or sides of the fin 110. A fin 110 may be used as a channel in a FinFET (field-effect transistor) structure, as is known to the person of ordinary skill in the art.

The fin 110 generally has a long horizontal dimension and a short horizontal dimension perpendicular to the long horizontal dimension. The section from which the view of FIG. 1 is taken is along the long horizontal dimension of the fin.

FIG. 1 also shows a plurality of dummy gates 115. The dummy gate 115 may comprise polysilicon or other suitable dummy gate materials known to the person of ordinary skill in the art. The dummy gate 115 generally has a long horizontal dimension and a short horizontal dimension perpendicular to the long horizontal dimension. The long horizontal dimension of the dummy gate 115 is perpendicular to the long horizontal dimension of the fin 110.

Adjacent to each dummy gate 115 of the plurality of dummy gates is an interlayer dielectric (ILD) layer 120. The ILD 120 may be formed of any suitable ILD material known to the person of ordinary skill in the art.

Between each dummy gate 115 and each ILD 120 is a spacer 125. The spacer 125 may be formed of silicon nitride or other materials known for use with dummy gate processes.

As depicted, the tops of the dummy gate 115, the ILD 120, and the spacer 125 may all be substantially coplanar. Overall, the semiconductor structure 100 depicted in FIG. 1 may be formed by patterning, etching, depositing, chemical-mechanical polishing (CMP), and other techniques known to the person of ordinary skill in the art.

Figure 2:
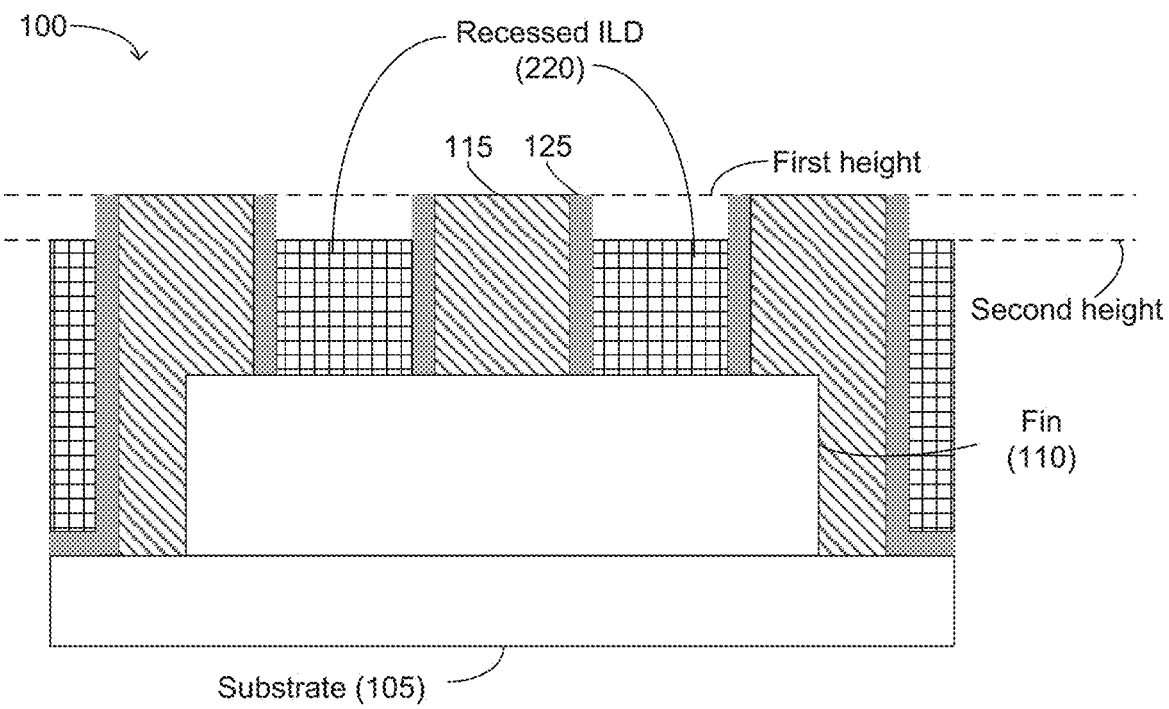
FIG. 2 illustrates a stylized depiction of a semiconductor structure after recessing an interlayer dielectric (ILD), in accordance with embodiments herein.

FIG. 2 depicts a stylized cross-sectional view of the semiconductor structure 100 after recessing the ILD 120, in accordance with embodiments herein. The ILD 120 may be recessed by any technique known to the person of ordinary skill in the art. In one embodiment, the ILD 120 may be recessed by a plasma-assisted dry etch process, such as a process that involves exposing the ILD 120 with $H_2$, $NF_3$ and $NH_3$ plasma by-products, e.g., a SiConi™ etch process. The result of etching is a recessed ILD 220.

Regardless how the ILD 120 is recessed, the top of the recessed ILD 220 is at a second height (as indicated by a dotted line) above the substrate 105. The top of the dummy gate 115 and the top of the spacer 125 remain at a first height (as indicated by a dotted line) above the substrate 105, wherein the first height is greater than (a.k.a. above) the second height.

Figure 3:
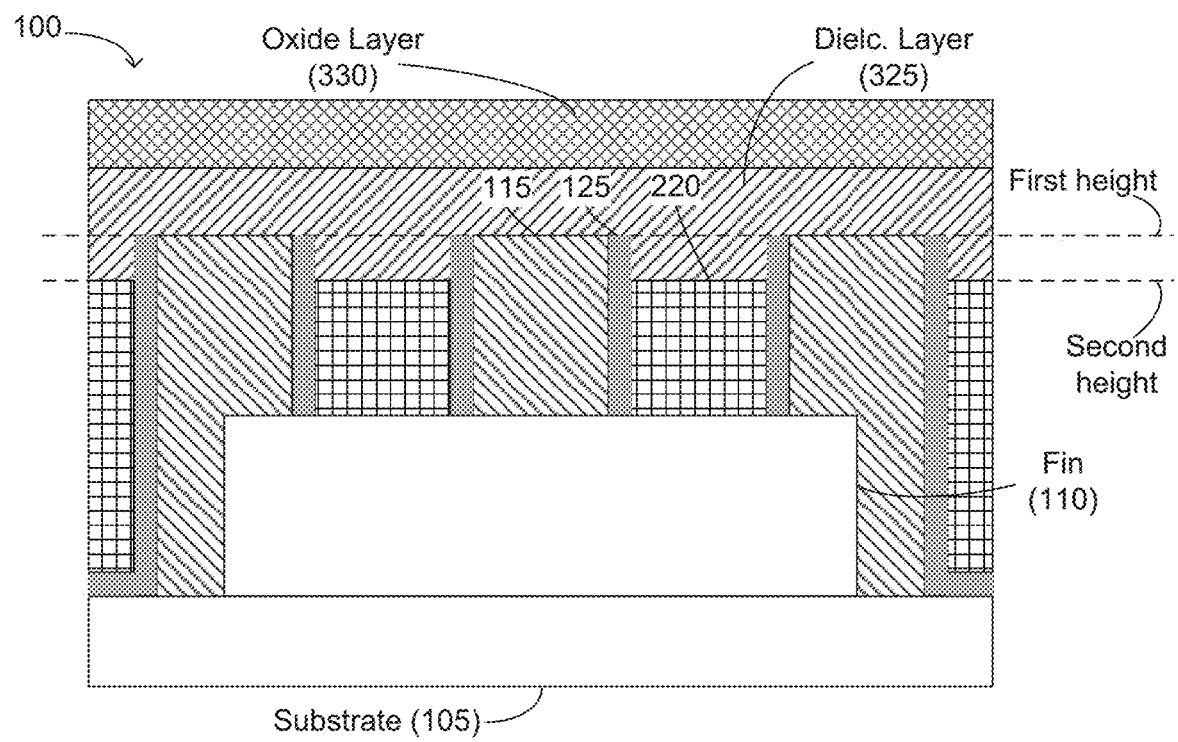
FIG. 3 illustrates a stylized depiction of a semiconductor structure after depositing a dielectric layer and an oxide layer, in accordance with embodiments herein.

FIG. 3 depicts a stylized cross-sectional view of the semiconductor structure 100 after depositing a dielectric layer and an oxide layer, in accordance with embodiments herein. The dielectric layer 325 may comprise any appropriate dielectric material and may be deposited by any appropriate technique. In one embodiment, the dielectric layer 325 comprises silicon carbon oxide (SiOC). The person of ordinary skill in the art is aware that SiOC may be referred to as "SPARC." As shown, the dielectric layer 325 is deposited over the semiconductor structure 100 to above the first height of the dummy gate 115 and the spacer 125.

An oxide layer 330 is then deposited over the dielectric layer 325. The oxide layer 330 may comprise any known oxide material. In one embodiment, the oxide layer 330 comprises a tetraethylorthosilicate (TEOS). Techniques for depositing oxide materials, including TEOS, are known to the person of ordinary skill in the art and need not be described further.

Figure 4:
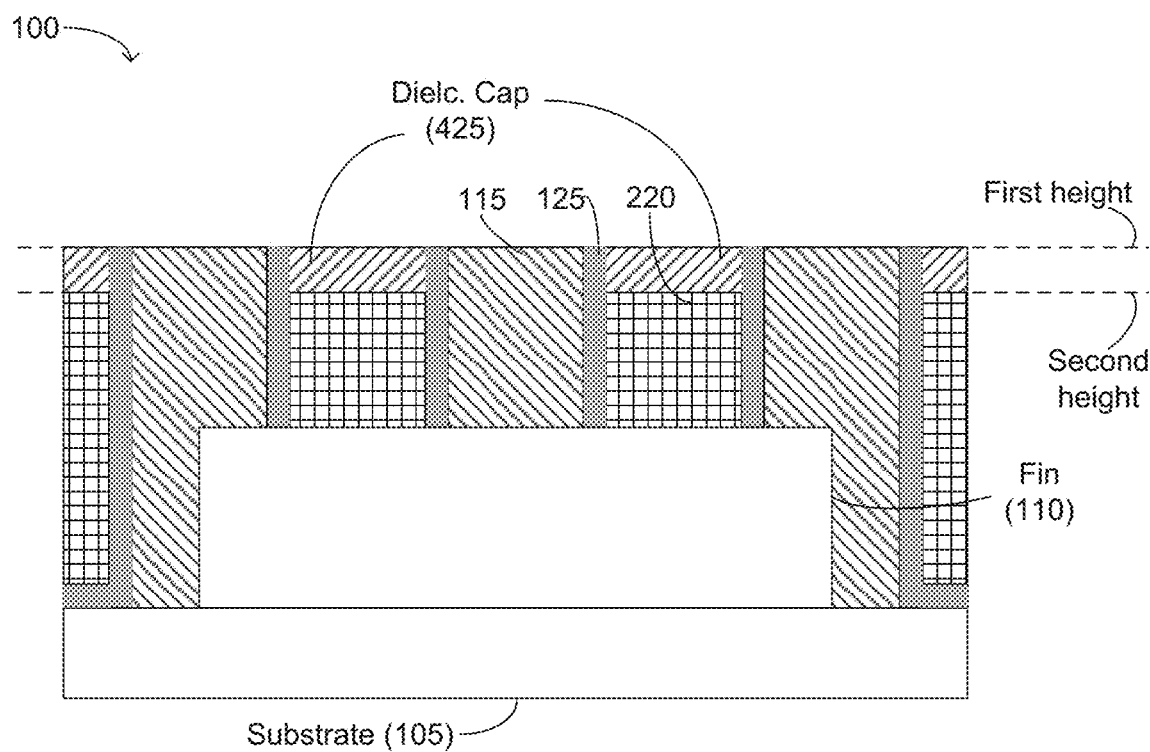
FIG. 4 illustrates a stylized depiction of a semiconductor structure after chemical mechanical polishing (CMP) and removing the oxide layer, in accordance with embodiments herein.

FIG. 4 illustrates a stylized cross-sectional depiction of the semiconductor structure 100 after chemical mechanical polishing (CMP) and removing the oxide layer, in accordance with embodiments herein. CMP may substantially remove the oxide layer 330 and substantially remove the dielectric layer 325 above the first height. Process parameters for CMP removal of oxide and dielectric materials are known to the person of ordinary skill in the art.

Although CMP is expected to substantially remove the entire oxide layer 330 and the portions of the dielectric layer 325 above the first height, some residual oxide may survive CMP. Accordingly, in some embodiments, a non-selective etch may be performed to remove residual oxide. The non-selective etch may be performed according to process parameters that can be determined by the person of ordinary skill in the art having the benefit of the present disclosure as a routine matter.

The CMP and, in some embodiments, non-selective etch yield a dielectric cap 425 disposed on the ILD 220. A top of the dielectric cap 425 is at substantially the first height above the substrate, i.e., is substantially coplanar with the top of the dummy gate 115 and the spacer 125.

Figure 5:
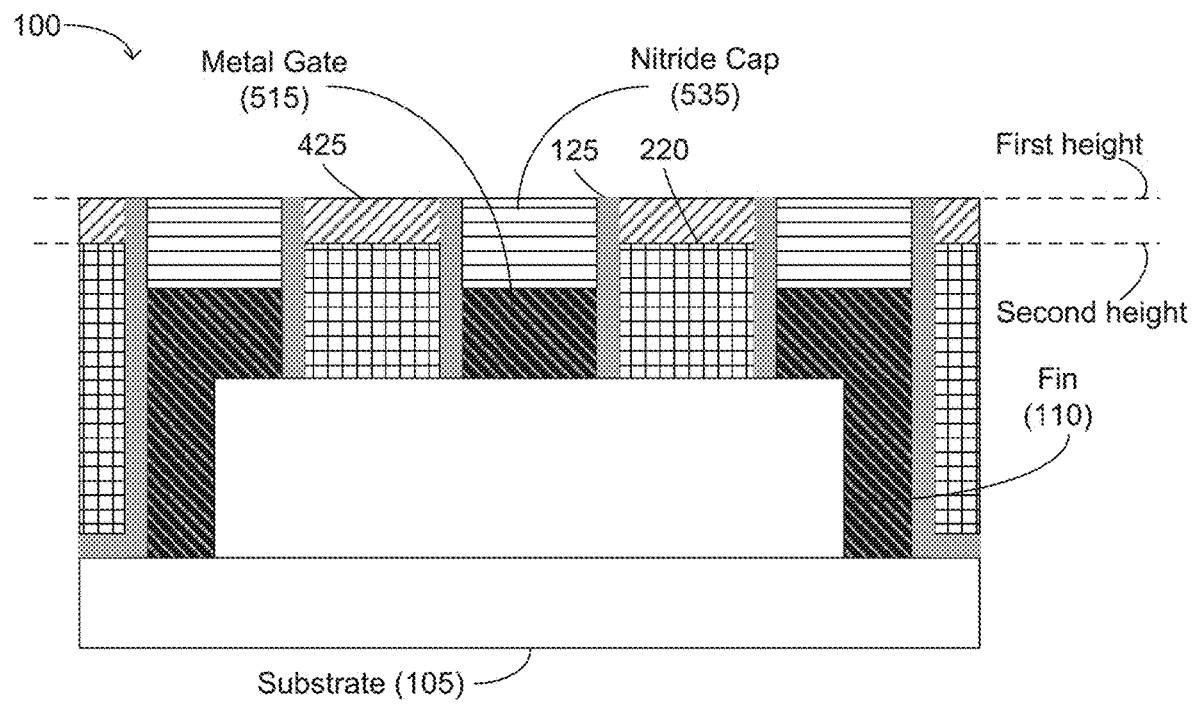
FIG. 5 illustrates a stylized depiction of a semiconductor structure after a replacement metal gate (RMG) process, in accordance with embodiments herein.

FIG. 5 depicts a stylized cross-sectional view of the semiconductor structure 100 after a replacement metal gate (RMG) process, in accordance with embodiments herein. Generally, the dummy gate 115 is removed and in its place is formed a gate stack comprising a metal gate 515 and a nitride cap 535. In one embodiment, the metal gate 515 comprises a high-k metal.

RMG processes are generally well known. For example, in embodiments wherein the dummy gate 115 comprises polysilicon, a reactive ion etch (ME) gate cut followed by a "poly pull" process may be performed to remove the dummy gate 115. Various processes may then be performed to functionalize channels in the fin 110 or other structures. The metal gate 515 and the nitride cap 535 may then be formed using known techniques. The metal gate 515 and the nitride cap 535 may be referred to herein as a "gate stack."

Though not to be bound by theory, the presence of the dielectric cap 425 on the ILD 220 is believed to at least partially protect the stack comprising the ILD 220 from height loss during an ME gate cut during the RMG process. In one embodiment, the top of the dielectric cap 425 is less than about 5 nm below the top of nitride cap 535. "Less than about 5 nm" encompasses embodiments (not shown) wherein the top of the dielectric cap 425 is above the top of the nitride cap 535, i.e., wherein the top of the dielectric cap 425 is less than about 0 nm below the top of nitride cap 535.

The depicted embodiments are in contrast to a prior art semiconductor device which may have the characteristic of an ILD that lacks a dielectric cap of an acceptable height. That is, embodiments herein may provide an advantage wherein the ILD is not subject to height loss, e.g., the highest point on the ILD is substantially not below the tops of the spacer and the nitride cap.

Generally, a top of the dielectric cap 425 is substantially at the first height above the substrate 105, i.e., is substantially coplanar with the top of the spacer 125. Though again not to be bound by theory, the presence of the dielectric cap 425 on the ILD 220 is believed to at least partially minimize gouging of the stack comprising the ILD 220. This is in contrast to many prior art semiconductor devices, in which an ILD may lack a dielectric cap. Therefore, in many prior art devices, the ILD is subject to gouging, e.g., the center of the top of the ILD is below the sides of the top of the ILD.

Figure 6:
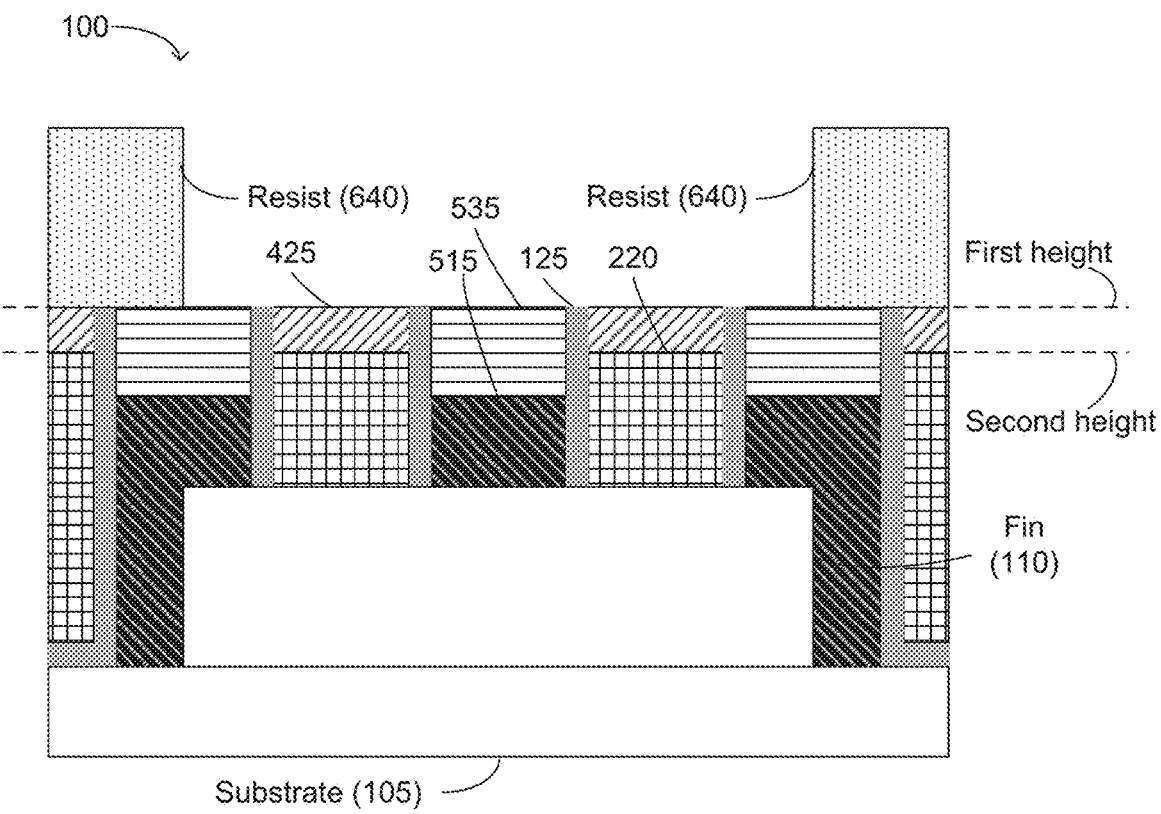
FIG. 6 illustrates a stylized depiction of a semiconductor structure after forming a resist, in accordance with embodiments herein.

FIG. 6 illustrates a stylized cross-sectional depiction of the semiconductor structure 100 after forming a resist, in accordance with embodiments herein. A resist material 640 may be formed to mask dielectric caps 425 that are not disposed over the fin 110. The resist 640 may comprise any known resist material and may be formed and patterned by techniques known to the person of ordinary skill in the art.

Figure 7:
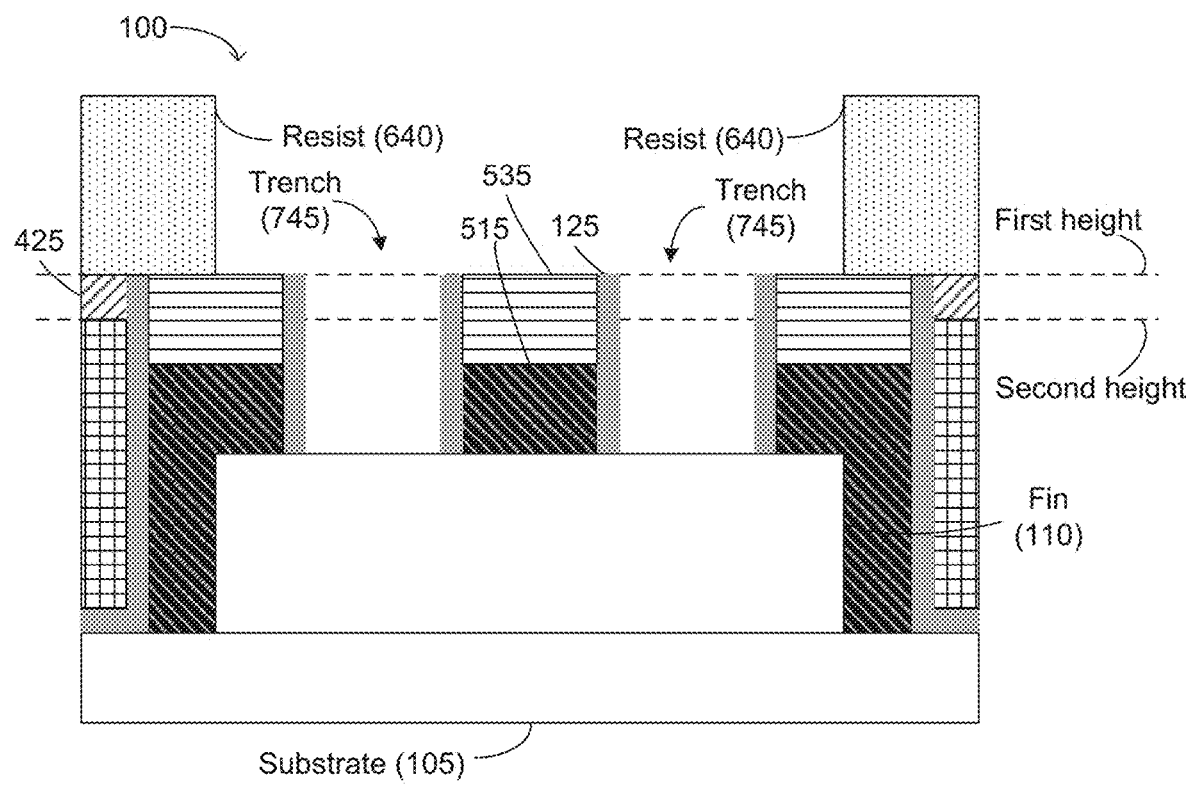
FIG. 7 illustrates a semiconductor structure after removal of the ILD and the dielectric cap, in accordance with embodiments herein.

FIG. 7 depicts a stylized cross-sectional view of the semiconductor structure 100 after removal of unmasked ILD 220 and unmasked dielectric cap 425, in accordance with embodiments herein. Removal of the unmasked ILD 220 and unmasked dielectric cap 425 can be performed by etching techniques which are selective for (i.e., do not etch) the resist 640, the nitride cap 535, and the spacer 125. In one embodiment, removal of the unmasked ILD 220 and the unmasked dielectric cap 425 may comprise a reactive ion etch (RIE). Removal of the unmasked ILD 220 and unmasked dielectric cap 425 yields a trench 745.

Figure 8:
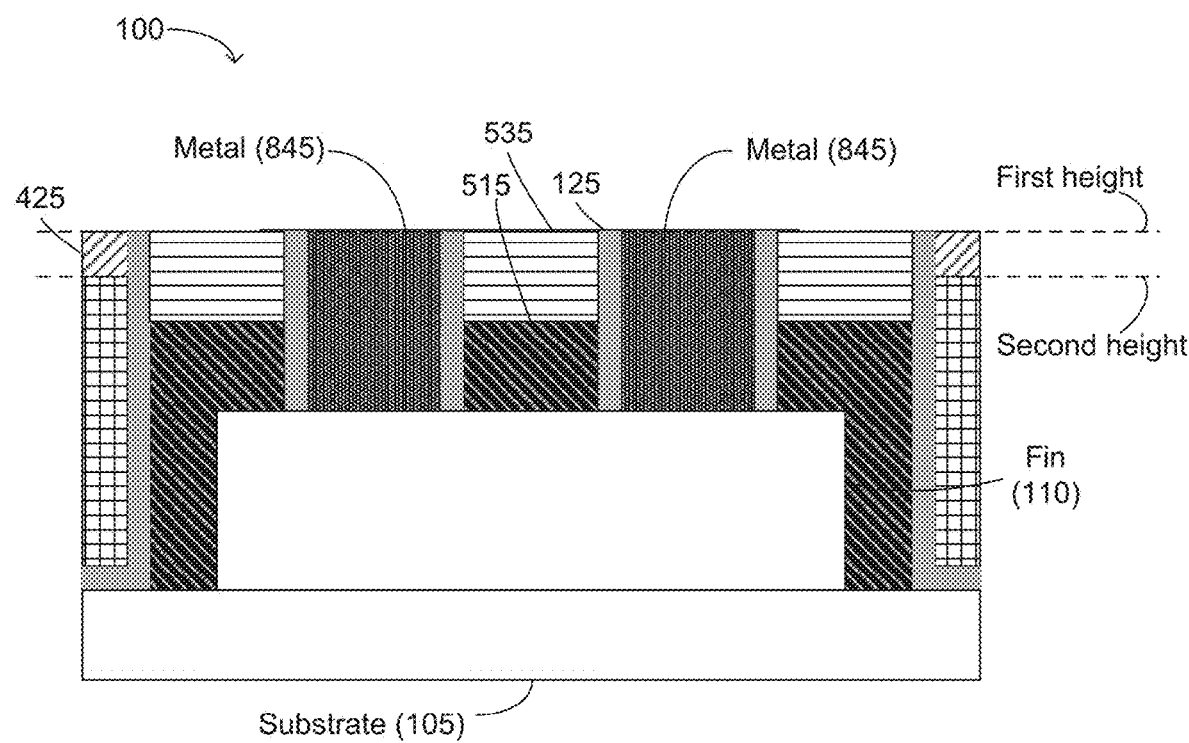
FIG. 8 illustrates a semiconductor structure after depositing a metal contact, in accordance with embodiments herein.

FIG. 8 illustrates a stylized cross-sectional view of the semiconductor structure 100 after depositing a metal contact, in accordance with embodiments herein. The trench 745 may be filled with a metal 845 by known techniques. The metal 845 may form a contact between the fin 110 and a metallization layer and/or other conductive structures to be formed in subsequent processing steps to yield a final semiconductor device. The metal 845 may comprise any metal known for contact formation, and may be selected as a routine matter by the person of ordinary skill in the art having the benefit of the present disclosure. In one embodiment, the metal 845 may be tungsten, copper, or cobalt.

Figure 9:
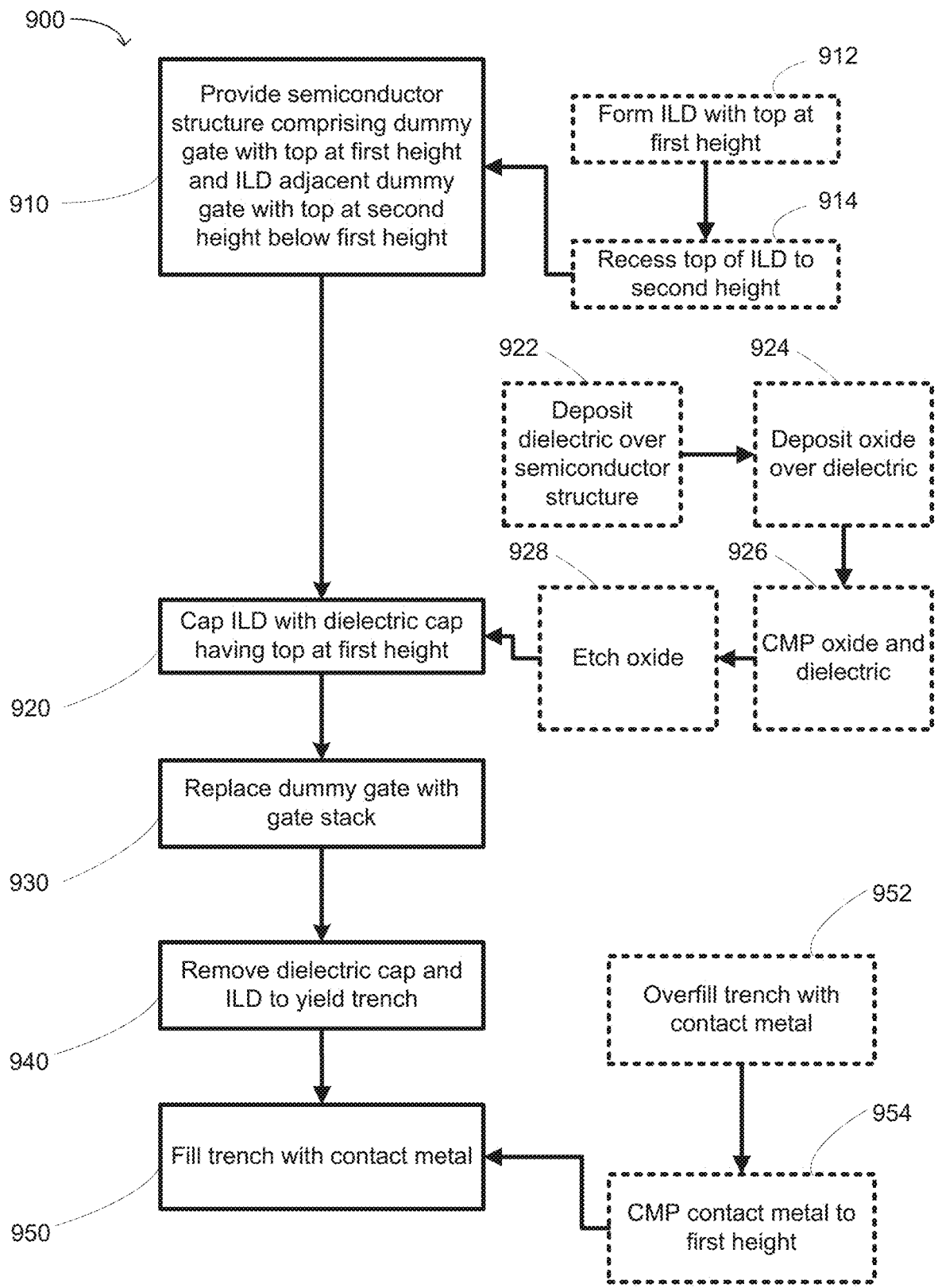
FIG. 9 illustrates a flowchart of a method, in accordance with embodiments herein.

FIG. 9 presents a flowchart of a method 900 in accordance with embodiments herein. The method 900 comprises providing (at 910) a semiconductor structure comprising a semiconductor substrate, a fin disposed on the semiconductor substrate; a dummy gate disposed over the fin, wherein the dummy gate has a top at a first height above the substrate and an interlayer dielectric (ILD) disposed over the fin and adjacent to the dummy gate; wherein the ILD has a top at a second height above the substrate, wherein the second height is below the first height.

In one embodiment, providing (at 910) may comprise forming (at 912) the ILD to have the top at the first height and recessing (at 914) the top of the ILD to the second height.

The method 900 also comprises capping (at 920) the ILD with a dielectric cap, wherein the dielectric cap has a top at the first height. In one embodiment, the dielectric cap may comprise silicon carbon oxide (SiOC).

In one embodiment, capping (at 920) may comprise depositing (at 922) the dielectric, e.g., SiOC, over the semiconductor structure, depositing (at 924) an oxide over the dielectric, chemical-mechanical polishing (CMP) (at 926) the oxide and the dielectric to the first height, and performing a non-selective etch (at 928) to remove oxide.

In one embodiment, the method 900 may further comprise replacing (at 930) the dummy gate with a gate stack comprising a metal gate electrode and a nitride cap. In one embodiment, after replacing (at 930), the top of the dielectric cap may be less than 5 nm below the top of the nitride cap.

The method 900 may additionally comprise removing (at 940) the dielectric cap and the ILD, to yield a trench. The method 900 may still further comprise filling (at 950) the trench with a contact metal.

In one embodiment, the contact metal may be selected from the group consisting of tungsten and cobalt. Alternatively or in addition, in one embodiment, filing (at 950) may comprise overfilling (at 952) the trench with the contact metal and performing CMP (at 954) to reduce a top of the contact metal to the first height.

Figure 10:
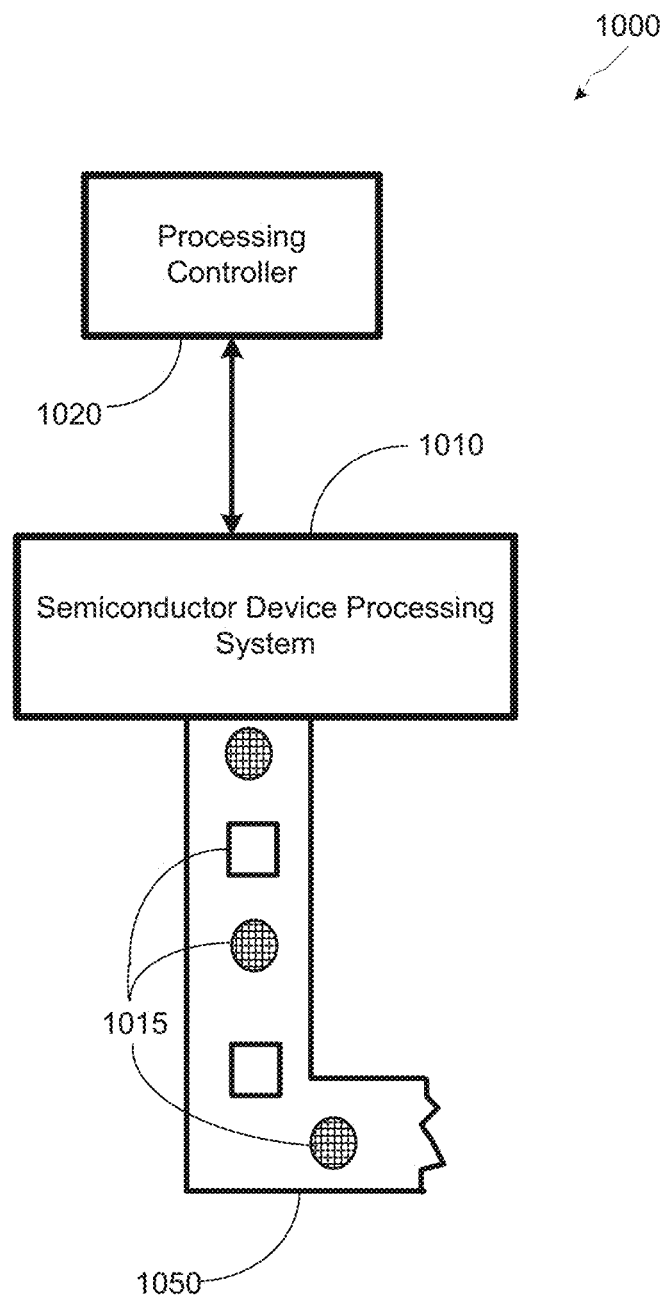
FIG. 10 illustrates a stylized depiction of a system for fabricating a semiconductor device, in accordance with embodiments herein.

Turning now to FIG. 10, a stylized depiction of a system for fabricating a semiconductor device wherein a step height difference between first and second regions, in accordance with embodiments herein, is illustrated. The system 1000 is capable of manufacturing semiconductor devices using the process steps described above.

The semiconductor device processing system 1010 may comprise various processing stations, such as etch process stations, photolithography process stations, CMP process stations, etc. One or more of the processing steps performed by the processing system 1010 may be controlled by the processing controller 1020. The processing controller 1020 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1010 may produce integrated circuits on a medium, such as silicon wafers. The processing system 1010 may provide processed integrated circuits/devices 1015 on a transport mechanism 1050, such as a conveyor system. In some embodiments, the conveyor system may be sophisticated clean room transport systems that are capable of transporting semiconductor wafers. In one embodiment, the semiconductor device processing system 1010 may perform one or more processing steps, e.g., one or more of those described above and depicted in FIG. 9.

In some embodiments, the items labeled "1015" may represent individual wafers, and in other embodiments, the items 1015 may represent a group of semiconductor wafers, e.g., a "lot" of semiconductor wafers. The integrated circuit or device 1015 may comprise a transistor, a capacitor, a resistor, a memory cell, a processor, and/or the like. In one embodiment, the device 1015 includes a plurality of transistors.

The system 1000 may be capable of performing analysis and manufacturing of various products involving various technologies. For example, the system 1000 may use design and production data for manufacturing devices of CMOS technology, Flash technology, BiCMOS technology, power devices, memory devices (e.g., DRAM devices), NAND memory devices, and/or various other semiconductor technologies.

The semiconductor device processing system 1010 may be adapted to perform one or more of the following:

provide a semiconductor substrate; a fin disposed on the semiconductor substrate; a dummy gate disposed over the fin, wherein the dummy gate has a top at a first height above the substrate; and an interlayer dielectric (ILD) disposed over the fin and adjacent to the dummy gate, wherein the ILD has a top at a second height above the substrate, wherein the second height is below the first height; and cap the ILD with a dielectric cap, wherein the dielectric cap has a top at the first height.

The semiconductor device processing system 1010 may be adapted to provide the semiconductor structure by forming the ILD to have the top at the first height and recessing the top of the ILD to the second height.

The semiconductor device processing system 1010 may be adapted to form the dielectric cap from silicon carbon oxide (SiOC).

The semiconductor device processing system 1010 may be adapted to cap the ILD by depositing dielectric (e.g., SiOC) over the semiconductor structure, depositing an oxide over the dielectric, chemical-mechanical polishing (CMP) the oxide and the dielectric to the first height, and performing a non-selective etch to remove oxide.

The semiconductor device processing system 1010 may be further adapted to:

replace the dummy gate with a gate stack comprising a metal gate electrode and a nitride cap;

remove the dielectric cap and the ILD, to yield a trench; and fill the trench with a contact metal.

The semiconductor device processing system 1010 may be adapted to fill the trench with tungsten or cobalt.

The semiconductor device processing system 1010 may be adapted to fill the trench by overfilling the trench with the contact metal and performing CMP to reduce a top of the contact metal to the first height.

The semiconductor device processing system 1010 may be adapted such that, after replacing the dummy gate with the gate stack, the top of the dielectric cap is less than 5 nm below the top of the nitride cap.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the disclosure. Accordingly, the protection sought herein is as set forth in the claims below.

What is claimed is:

1. A method, comprising:
    forming a fin disposed on a semiconductor substrate;
    forming a dummy gate disposed over said fin, wherein said dummy gate has a top at a first height above said semiconductor substrate;
    forming an interlayer dielectric (ILD) feature disposed over and in physical contact with said fin and adjacent said dummy gate, wherein said ILD has a top at a second height above said semiconductor substrate, and wherein the second height is below the first height;
    capping said ILD with a dielectric cap, wherein the dielectric cap has a top at the first height;
    replacing said dummy gate with a gate stack comprising a metal gate electrode and a nitride cap;
    removing said dielectric cap and the ILD, to yield a trench; and
    filling said trench with a contact metal, wherein filling the trench with the contact metal comprises overfilling the trench with the contact metal and performing chemical-mechanical polishing (CMP) to reduce a top of the contact metal to the first height.

2. The method of claim 1, wherein forming said ILD feature comprises forming the ILD to have the top at the first height and recessing the top of the ILD to the second height.

3. The method of claim 1, wherein capping said ILD with a dielectric cap comprises capping said ILD with a dielectric cap that comprises silicon carbon oxide (SiOC).

4. The method of claim 3, wherein capping said ILD comprises depositing SiOC over said fin, said dummy gate, and said ILD; depositing an oxide over the SiOC, chemical-mechanical polishing (CMP) the oxide and the SiOC to the first height, and performing a non-selective etch to remove oxide.

5. The method of claim 1, wherein the contact metal is selected from the group consisting of tungsten, copper, and cobalt.

6. The method of claim 1, wherein replacing said dummy gate with said gate stack comprises forming the gate stack such that the top of the dielectric cap is less than 5 nm below the top of the nitride cap.

7. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
provide a semiconductor substrate; a fin disposed on the semiconductor substrate; a dummy gate disposed over the fin, wherein the dummy gate has a top at a first height above the semiconductor substrate; and an inter-layer dielectric (ILD) disposed over and in physical contact with the fin and adjacent to the dummy gate, wherein the ILD has a top at a second height above the semiconductor substrate, wherein the second height is below the first height;
cap the ILD with a dielectric cap, wherein the dielectric cap has a top at the first height;
replace said dummy gate with a gate stack comprising a metal gate electrode and a nitride cap;
remove said dielectric cap and the ILD, to yield a trench; and
fill said trench with a contact metal, wherein to fill the trench with the contact metal, the semiconductor device processing system is adapted to overfill the trench with the contact metal and perform chemical-mechanical polishing (CMP) to reduce a top of the contact metal to the first height.

8. The system of claim 7, wherein the semiconductor device processing system is adapted to form the ILD to have the top at the first height and recess the top of the ILD to the second height.

9. The system of claim 7, wherein the semiconductor device processing system is adapted to form the dielectric cap from silicon carbon oxide (SiOC).

10. The system of claim 9, wherein the semiconductor device processing system is adapted to cap the ILD by depositing SiOC over aid fin, said dummy gate, and said ILD; depositing an oxide over the SiOC, chemical-mechanical polishing (CMP) the oxide and the SiOC to the first height, and performing a non-selective etch to remove oxide.

11. The system of claim 7, wherein the semiconductor device processing system is adapted to form the contact metal from tungsten or cobalt.

12. The system of claim 7, wherein, after the semiconductor device processing system replaces the dummy gate with the gate stack, the top of the dielectric cap is less than 5 nm below the top of the nitride cap.

* * * * *